United States Patent [19]

Guckel et al.

[11] Patent Number: 5,576,147

[45] Date of Patent: Nov. 19, 1996

[54] FORMATION OF MICROSTRUCTURES USING A PREFORMED PHOTORESIST SHEET

[75] Inventors: Henry Guckel; Todd R. Christenson; Kenneth Skrobis, all of Madison, Wis.

[73] Assignee: Wisconsin Alumni Research Foundation, Madison, Wis.

[21] Appl. No.: 461,983

[22] Filed: Jun. 5, 1995

Related U.S. Application Data

[62] Division of Ser. No. 340,617, Nov. 16, 1994, Pat. No. 5,496,668, which is a division of Ser. No. 66,988, May 24, 1993, Pat. No. 5,378,583, which is a continuation-in-part of Ser. No. 994,952, Dec. 22, 1992, abandoned.

[51] Int. Cl.$^6$ .................................. G03F 7/00; G03F 7/26
[52] U.S. Cl. ........................ 430/313; 430/314; 430/315; 430/323; 430/324; 430/325
[58] Field of Search ..................... 430/311, 313, 430/314, 315, 317, 322, 324, 323, 325, 326

[56] References Cited

U.S. PATENT DOCUMENTS

| | | | |
|---|---|---|---|
| 3,449,221 | 6/1969 | Thomas | 430/323 |
| 3,535,137 | 10/1970 | Haller et al. | 427/553 |
| 3,886,584 | 5/1975 | Cook, Jr. et al. | 257/410 |
| 3,984,582 | 10/1976 | Feder et al. | 430/296 |
| 4,018,938 | 4/1977 | Feder et al. | 430/296 |
| 4,035,522 | 7/1977 | Hatzakis | 430/5 |
| 4,107,351 | 8/1978 | James et al. | 430/323 |
| 4,351,653 | 9/1982 | Becker et al. | 55/394 |
| 4,422,905 | 12/1983 | Becker et al. | 205/75 |
| 4,493,753 | 1/1985 | Becker et al. | 205/73 |
| 4,541,977 | 9/1985 | Becker et al. | 264/102 |
| 4,563,250 | 1/1986 | Becker et al. | 205/50 |
| 4,563,251 | 1/1986 | Becker et al. | 205/50 |
| 4,661,212 | 4/1987 | Ehrfeld et al. | 205/75 |
| 4,693,791 | 9/1987 | Becker et al. | 205/50 |
| 4,694,548 | 9/1987 | Ehrfeld et al. | 205/75 |
| 4,698,285 | 10/1987 | Ehrfeld et al. | 430/5 |
| 4,703,559 | 11/1987 | Ehrfeld et al. | 29/854 |
| 4,705,605 | 11/1987 | Becker et al. | 205/75 |

(List continued on next page.)

FOREIGN PATENT DOCUMENTS

| | | |
|---|---|---|
| 0158357 | 10/1985 | European Pat. Off. . |
| 0234553 | 9/1987 | European Pat. Off. . |
| 0607680 | 7/1994 | European Pat. Off. . |

OTHER PUBLICATIONS

Brochure (in German) "Die LIGA–Technik", by MicroParts, Gesellschaft, 1990.

E. W. Becker, et al., "Fabrication of Microstructures with High Aspect Ratio and Great Structural Heights by Synchrotron Radiation Lithography Galvanoforming and and Plastic Moulding (LIGA process)", Microelectronic Engineering, vol. 4, No. 1, May 1986, pp. 35–56.

W. Ehrfeld, et al., "Fabrication of Microstructures Using the LIGA Process", Proc. IEEE Micro Robots and Teleoperators Workshop, Nov. 9–11, 1987, pp. 1–11.

(List continued on next page.)

*Primary Examiner*—Kathleen Duda
*Attorney, Agent, or Firm*—Foley & Lardner

[57] ABSTRACT

In the formation of microstructures, a preformed sheet of photoresist, such as polymethylmethacrylate (PMMA), which is strain free, may be milled down before or after adherence to a substrate to a desired thickness. The photoresist is patterned by exposure through a mask to radiation, such as X-rays, and developed using a developer to remove the photoresist material which has been rendered susceptible to the developer. Micrometal structures may be formed by electroplating metal into the areas from which the photoresist has been removed. The photoresist itself may form useful microstructures, and can be removed from the substrate by utilizing a release layer between the substrate and the preformed sheet which can be removed by a remover which does not affect the photoresist. Multiple layers of patterned photoresist can be built up to allow complex three dimensional microstructures to be formed.

16 Claims, 10 Drawing Sheets

U.S. PATENT DOCUMENTS

| | | | |
|---|---|---|---|
| 4,738,010 | 4/1988 | Ehrfeld et al. | 29/898.12 |
| 4,780,382 | 10/1988 | Stengl et al. | 430/5 |
| 4,784,935 | 11/1988 | Ehrfeld et al. | 430/321 |
| 4,797,211 | 1/1989 | Ehrfeld et al. | 210/321.84 |
| 4,872,888 | 10/1989 | Ehrfeld et al. | 210/500.35 |
| 5,189,777 | 3/1993 | Guckel et al. | 29/424 |
| 5,190,637 | 3/1993 | Guckel | 205/118 |
| 5,206,983 | 5/1993 | Guckel et al. | 29/598 |
| 5,327,033 | 7/1994 | Guckel et al. | 310/40 MM |
| 5,357,807 | 10/1994 | Guckel et al. | 73/721 |
| 5,378,583 | 1/1995 | Guckel et al. | 430/325 |

OTHER PUBLICATIONS

P. Hagmann, et al., "Fabrication of Microstructures of Extreme Structural Heights by Reaction Injection Moulding", Int'l. Polymer Processing IV, 1989, pp. 188–195.

W. Ehrfeld, et al., "Microfabrication of Sensors and Actuators for Microrobots," Proc. IEEE Int'l. Workshop on Intelligent Robots and Systems, Tokyo, Japan, Oct. 31–Nov. 2, 1988, pp. 3–7.

W. Ehrfeld, "Three Dimensional Microfabrication Using Synchrotron Radiation", Int'l. Symposium on X–Ray Synchrotron Radiation and Adv. Science and Tech., Feb. 15–16, 1990, pp. 121–141.

W. Ehrfeld, et al., "LIGA Process: Sensor Construction Techniques Via X–Ray Lithography," Tech. Digest, IEEE Solid State Sensor and Actuator Workshop, 1988, pp. 1–4.

H. Guckel, et al., "Deep X–Ray & UV Lithographies for Micromechanics", Tech. Dig., IEEE Solid Sta. Sensor & Actuator Workshop, Hilton Head, SC, Jun. 4–7, pp. 118–122.

H. Guckel, et al., "Microstructure Sensors," International Electron Device Meeting (IEDM), San Francisco, California, Dec. 1990.

H. Guckel, et al., "Febrication of Assembled Micromechanical Components via Deep X–Ray Lithography", Proceedings of IEEE Micro Electro Mechanical Systems (MEMS) 1991, Nara, Japan, 30 Jan.–2 Feb., 1991.

W. Menz, et al., "The LIGA Technique–a Novel Concept for Microstructures and the Combination with Si–Technologies by Injection Moulding", Proceedings IEEE Micro Electro Mech. Systems (MEMS) 1991, Nara, Japan, 30 Jan.–2 Feb., 1991, pp. 69–73.

PiRL: Polyimide Release Layer, brochure from Brewer Science, Inc.

Roger T. Howe, et al., "Silicon Micromechanics: Sensors and Actuators on a Chip", IEEE Spectrum, Jul., 1990, pp. 29–35.

J. Mohr, et al., "Fabrication of Microsensor and Microactuator Elements by the LIGA–Process," Proceedings of Transducers '91, San Francisco, CA, Jun. 24–27, 1991, pp. 607–609.

H. Guckel, et al., "Fabrication and Testing of the Planar Magnetic Micromotor Journal of Micromechanics and Microengineering", IOP Publishing, England, vol. 1, No. 3, Dec. 1991.

H. Guckel, "Silicon Microsensors: Construction, Design and Performance," Euro. Solid State Conf., Montreaux, Switzerland, Sep. 1991, pp. 387–398.

H. Guckel, "On the Application of Deep X–Ray Lithography and Metal Plating to Micromechanics and Micromagnetics," The Second Int'l. Symp. on MicroMachine and Human Science, Nagoya, Japan, Oct. 8 and 9, 1991.

H. Guckel, et al., "On the Application of Deep X–Ray Lithography With Sacrificial Layers to Sensor and Actuator Construction (the Magnetic Micromotor with Power Take-offs)," Proceedings '91 of Transducers '91, San Francisco, CA, Jun. 24–27, 1991.

H. Guckel, et al., "Microactuator Production Via High Aspect Ratio, High Edge Acuity Metal Fabrication Technology," Microtech. and Applications to Space Sys. Conf., JPL, Pasadena, CA, May 27, 1992.

H. Guckel, et al., "Fabrication and Testing of Metal Micromechanisms With Rotational and Translational Motion," SPIE Conf., Orlando, Florida, May, 1992.

H. Guckel, et al., "Deep X–Ray Lithography, Metal Plating and Assembly As Fabrication Tools for Micromechanics," 11th Sensor Symposium, Japan IEE, Tokyo, Japan, Jun., 1992.

H. Guckel, et al., "Metal Micromechanisms Via Deep X–Ray Lithography, Electroplating and Assembly," Actuators '92, Bremen, Germany, Jun. 22, 1992.

H. Guckel, "Micromechanics" A Multifaceted Technology for New and Improved Products, Interkama Conference, Germany, Oct., 1992.

Jurgen Mohr, "Analyse der Defektursachen und der Genauigkeit der Strukturubertragung bei der Rontgentiefenlithographie mit Synchrotronstrahlung," Dissertation, Zur Erlangung des akademischen Grades eines Doktor–Ingenieurs an der Fakultat fur Maschinenbau der Universitat Karlsruhe, 1986, p. 21 (in German, with English translation, in part).

Andreas Stutz, "Untersuchungen Zum Entwicklungsverhalten eines Rontgenresist aus Vernetztem Polyethylmethacrylat," Diplomarbeit, Institut fur Kernverfahrenstechnik des Kernforschungszentrums Karlsruhe und der Universitat Karlsruhe, 1986, p. 6 (in German) with English translation of Sec. 2.1, first para., p. 6.

"Multilayer Circuit Fabrication Using Double Exposure of Positive Resist," IBM Technical Disclosure Bulletin, vol. 36, No. 10, Oct. 1993.

FORMATION OF MICROSTRUCTURES USING A PREFORMED PHOTORESIST SHEET

This invention was made with United States Government support awarded by the National Science Foundation (NSF), Grant No. EET 8815285. The United States Government has certain rights in this invention.

This is a divisional of application Ser. No. 08/340,617 filed on Nov. 16, 1994, U.S. Pat. No. 5,496,668 which is a divisional of application Ser. No. 08/066,988, filed Mar. 24, 1993 now U.S. Pat. No. 5,378,583, which is a continuation-in-part of application Ser. No. 07/994,952, filed Dec. 22, 1992, now abandoned.

FIELD OF THE INVENTION

This invention pertains generally to the field of semiconductor and micromechanical devices and processing techniques therefor, and particularly to the photoresist used in formation of microminiature structures such as those formed of metal.

BACKGROUND OF THE INVENTION

Deep X-ray lithography involves a substrate which is covered by a thick photoresist, typically several hundred microns in thickness, which is exposed through a mask by X-rays. X-ray photons are much more energetic than optical photons, which makes complete exposure of thick photoresist films feasible and practical. Furthermore, since X-ray photons are short wavelength particles, diffraction effects which typically limit device dimensions to two or three wavelengths of the exposing radiation are absent for mask dimensions above 0.1 micron. If one adds to this the fact that X-ray photons are absorbed by atomic processes, standing wave problems, which typically limit exposures of thick photoresists by optical means, become a nonissue for X-ray exposures. The use of a synchrotron for the X-ray sources yields high flux densities—several watts per square centimeter—combined with excellent collimation to produce thick photoresist exposures without any horizontal runout. Locally exposed patterns should therefore produce vertical photoresist walls if a developing system with very high selectivity between exposed and unexposed photoresist is available. This requirement has been satisfied using polymethylmethacrylate (PMMA) as the X-ray photoresist, and an aqueous developing system. See, H. Guckel, et al., "Deep X-ray and UV Lithographies for Micromechanics," Technical Digest, Solid State Sensor and Actuator Workshop, Hilton Head, S.C., Jun. 4–7, 1990, pp. 118–122.

Deep X-ray lithography may be combined with electroplating to form high aspect ratio structures. To do so requires that the substrate be furnished with a suitable plating base prior to photoresist application. Commonly, this involves a sputtered film of adhesive metal, such as chromium or titanium, which is followed by a thin film of metal which is suitable for electroplating the metal to be plated. In appropriate cases, the use of an initial layer of adhesive metal is not necessary. Exposure through a suitable mask and development are followed by electroplating. This process results, after cleanup, in fully attached metal structures with very high aspect ratios. Such structures were reported by W. Ehrfeld and co-workers at the Institute for Nuclear Physics (KFK) at Karlsruhe in West Germany. Ehrfeld termed the process "LIGA" based on the first letters for the German words for lithography and electroplating. A general review of the LIGA process is given in the article by W. Ehrfeld, et al., "LIGA Process: Sensor Construction Techniques Via X-Ray Lithography," Technical Digest IEEE Solid State Sensor and Actuator Workshop, 1988, pp. 1–4.

A crucial factor in the production of microminiature devices, such as those formed by the LIGA process, is the photoresist that is used. As noted, PMMA has been successfully used as the photoresist for formation of LIGA structures. The PMMA films have been produced by casting of liquid MMA directly on the substrate, with the film being reduced to the desired thickness, generally not more than two to three hundred microns, with a casting jig. The cast film is then solidified, typically by utilizing a polymerization agent or initiator in the casting solution and a cross-linking agent which results in cross-linking upon curing. There are several disadvantages and limitations of the PMMA films formed in this manner. The casting procedures require special equipment and fixturing, which adds to the time and cost of the process. As with almost all casting operations, a heat cycle is necessary to produce the solidified film. Typically, annealing cycles up to 110° C. are required. These heat cycles build up strain in the film due to a significant mismatch in thermal expansion coefficients between the PMMA photoresist and the substrate. Internal strain in the photoresist also occurs due to the shrinking of the film during curing, which has been observed to result in up to a 20% shrinkage of the film from its as-cast state. As a consequence, the cast film, after curing, often has poor adhesion to the substrate and can buckle off the substrate. Even where adhesion to the substrate is retained, the internal strain that is built into the film can result in distortion of the walls formed in the film after patterning of the photoresist by X-ray exposure and development.

PMMA photoresist films are typically cross-linked through the addition of a cross-linking agent to the casting solutions to minimize crazing of the films. Because of this cross-linking, it is necessary to have an additional X-ray exposure step, a blanket exposure of the entire photoresist film, followed by development of the film to remove the resist when its use is complete. Even with the use of cross-linking agents, the maximum thickness of resists which have been successfully cast, exposed, and developed have been in the range of about 300 microns. Most samples of PMMA photoresist films having thickness greater than 200 microns have unacceptable amounts of crazing and adhesion loss. Typically, the cast PMMA films may only be used once because such films are found to exhibit significant crazing after the microplating of metal into the patterned openings in the film during the electroplating step of the LIGA process.

The thicknesses of photoresist utilized for micromechanical processing is typically a few hundred microns or less, which is below the typical thicknesses of preformed photoresist sheets. Ehrfeld and co-workers have reported attempts to adhere a preformed PMMA photoresist sheet to a substrate, with the photoresist being calendered before adherence to the substrate to reduce the sheet to the desired thickness for carrying out the LIGA process. However, such attempts were reported to be unsuccessful, apparently because the strain fields in the calendered photoresist were excessive.

SUMMARY OF THE INVENTION

In accordance with the present invention, production of microstructures is facilitated by utilizing a photoresist structure which comprises a preformed sheet which can be adhered to a substrate before further processing so as to yield essentially no or very little strain within the photoresist. The preformed sheet is of conventional thickness, which allows convenient handling of the sheet as it is adhered to the substrate, with the thickness of the sheet being reduced to the desired thickness for the formation of microstructures by mechanically removing a portion of the sheet, as by milling by a micromill. A preferred photoresist sheet is formed of substantially non-crosslinked linear polymethylmethacrylate which has a very high average molecular weight and which is essentially strain free. Either before or after the sheet of photoresist is reduced to the desired thickness, the photoresist may be patterned by exposure through a mask to radiation which will affect the susceptibility of the exposed photoresist material to a developer. Depending on the photoresist used, the radiation may be X-ray radiation such as from a synchrotron or, in appropriate cases, deep UV light. The exposed portions of the photoresist (or unexposed portions, depending on the type of photoresist) may then be removed in a suitable developer.

For carrying out the formation of electroplated microstructures utilizing the present invention, a plating base is applied to a substrate prior to the photoresist. A non-exposed photoresist may then be adhered onto the plating base, and the photoresist then exposed. The exposed portions are then removed using a developer, and metal is then electroplated onto the exposed plating base to fill the area defined by the void(s) in the photoresist. The remaining photoresist may then be removed. Where the photoresist is formed of non-crosslinked PMMA, removal can take place by utilizing a solvent which dissolves the non-crosslinked PMMA. Where a cross-linked PMMA sheet is utilized, an additional blanket exposure to synchrotron X-rays is required before the photoresist is removed. By utilizing the preferred non-crosslinked PMMA photoresist sheet, this additional exposure step can be avoided, which produces a significant savings in time and expense over procedures which require a blanket exposure.

Where the photoresist is to be applied over existing structures formed on a substrate, relatively thin coats of conventional photoresist, such as PMMA, may then be spun onto the substrate to cover the structures. The photoresist sheet is then placed on top of the spun on photoresist and the interface between the two is wetted with a monomer. For example, with high molecular weight PMMA being utilized as the material of the photoresist sheet, a lower molecular weight PMMA dissolved in a solvent is spun on to the substrate to cover the mechanical structures, and the monomer, liquid methylmethacrylate, is then applied to the interface between the two which results in a solvent bonding of the materials at the interface. The preformed photoresist sheet is generally much thicker than the spun on photoresist, which need only be thick enough to cover the existing structures, typically a few microns or tens of microns in height.

The adherence of a preformed photoresist layer onto the substrate, and the mechanical milling of the photoresist sheet to a desired thickness, results in a photoresist of any desired thickness which can be precisely controlled using the mechanical milling process. Good adhesion of the photoresist sheet to the substrate is obtained and with very low internal strain within the photoresist. Consequently, much thicker photoresist structures can be formed than has heretofore been possible utilizing conventional photoresist materials without substantial distortion of the walls of the photoresist during the process of exposing the photoresist and removing the exposed resist with developer. The photoresist of the invention may be utilized during more than one electro-deposition process, inasmuch as the preformed PMMA sheet exhibits much less crazing and other damage during the electro-plating process than is observed in conventional cast PMMA photoresist layers.

The present invention may further be used to produce photoresist structures which can be released from the substrate. The strain free photoresist sheet, e.g., PMMA, either linear or cross-linked, is adhered to a release layer on a substrate. After the photoresist sheet is patterned, the release layer may be removed by a remover which etches or dissolves the release layer without substantially affecting the remaining photoresist. Because the photoresist sheet is strain free, the photoresist parts which are thus freed from the substrate are dimensionally stable and will not distort or curl.

The present invention also allows multiple layers of patterned photoresist to be constructed which can be applied to a substrate or utilized as a separate product. Such multiple layer structures allow the formation of metal structures by electrodeposition which can have a variety of shapes which vary in all three dimensions. For example, the metal structures may be formed having upper portions which are wider or which extend outwardly from the lower portions, and which undergo several variations in geometry from the top to the bottom of the structure. Such multiple layer photoresist structures can be formed in various manners in accordance with the present invention. In an exemplary multiple layer process, a second layer of photoresist is bonded to the upper surface of the first layer after the first layer has been exposed but before it has been developed. The second layer is then milled to the desired thickness and an X-ray exposure of the second layer photoresist takes place. The exposed photoresist is then developed (removed) and metal structures may be electroplated in the voids vacated by the exposed photoresist. Structures having more than two layers may be built up in this manner. Generally, it is necessary when utilizing this process that the exposure for the second layer (or subsequent layers) either lie within the exposed regions in the first layer (or all underlying layers) or that the incident X-rays be sufficient to fully penetrate and expose all layers of photoresist.

In another exemplary multilayer process, a layer of preformed photoresist (e.g. linear or cross-linked PMMA) which is not adhered to a substrate is exposed on one side. The photoresist sheet may be quite thick, e.g. 1 mm to 3 mm, so that the incident X-rays do not necessarily cause sufficient exposure of the photoresist in all exposed areas to allow the photoresist sheet to be fully exposed all the way through. The exposed photoresist may then be developed with a developer to remove it, and then the preformed sheet may be bonded to a substrate on the side which had been exposed and developed. The free side of the photoresist is then milled down to a desired thickness which is below the level at which all of the areas exposed to X-rays were sufficiently exposed so that they will be completely removed by the photoresist to leave a pattern of voids therein. This provides an initial single layer structure which is equivalent to a structure produced by bonding a photoresist to a substrate first, and then a milling to a desired thickness and then exposing to X-rays and developing the exposed photoresist. However, multiple photoresist layers may be formed by treating a free sheet (unbonded to a substrate) of photoresist in this manner, whether the initial layer is formed in this manner or is formed after being adhered to the substrate. For example, the second sheet of photoresist may be exposed to X-rays on one side in a desired pattern, the exposed photoresist developed to remove it, and then the surface of the photoresist which has been exposed may be bonded to the free surface of the first layer, with milling of the free surface of the second layer carried out to reduce the thickness of the second layer to below the level at which the exposed photoresist has been developed and fully removed to leave a pattern of voids. Third and additional layers may be formed in a similar manner.

The preformed photoresist sheet may also be exposed on one side and a first layer bonded to a substrate (or to a previously applied photoresist layer) at the surface which had been exposed to X-rays, but without developing the exposed photoresist. The sheet is then milled down to a level which is below the level at which the exposed photoresist would be fully removed from the developer. The photoresist may then be removed immediately. However, it is not necessary to do so, and a second preformed photoresist sheet may be treated in a similar manner, exposing one side to X-rays partially through, adhering the exposed side to the prior layer, and then milling down the second layer to a thickness such that all areas of the photoresist which were exposed to X-rays are sufficiently fully exposed so that they will be fully developed. When the desired number of layers have been built up, the entire laminated structure may be developed with a liquid photoresist developer to remove all of the exposed photoresist. In this process, it is necessary that the areas of exposed photoresist in each layer overlap one another so that the developer can work through the layers to remove all of the exposed photoresist. Alternatively, the exposed regions must be accessible at the side edges of the laminate.

In either of the above-processes, it is not essential that the substrate be a metallic substrate. For example, the substrate may comprise a thick photoresist sheet, or a variety of other materials, including a semiconductor wafer with or without electronic circuitry thereon. This initial thick photoresist sheet may also have been previously processed so that it contains either developed structures or undeveloped X-ray exposed regions. Additional photoresist layers are then bonded to the first layer and milled in sequence to form a laminate, with the various layers either being developed before or after they are bonded together. The initial thick photoresist sheet which had acted as the substrate may then be milled at its exposed side to reduce it to a desired thickness which exposes either the developed photoresist in the sheet or the fully developed structures. The entire multilayer laminate may then be bonded to a metal substrate for electrodeposition, or the laminate may be utilized itself as a structural component. For example, the undeveloped photoresist structure may be formed in desired three dimensional shapes which can be utilized for various purposes, for example as molds, or as structural components. Multilayer laminates can include, for example, multiple channels which can be used to provide conduits for liquid or gases, or conductive paths.

Where the photoresist sheet or laminate is applied to a semiconductor (e.g., single crystal silicon) substrate having microcircuits formed thereon, the sheet or laminate may be fully exposed, and developed if desired, as described above, before being adhered to the substrate. In this manner, no radiation need be applied to the photoresist when it is on the substrate which could damage microcircuits on the substrate.

Further objects, features and advantages of the invention will be apparent from the following detailed description when taken in conjunction with the accompanying drawings.

DETAILED DESCRIPTION OF THE INVENTION

Figure 1:
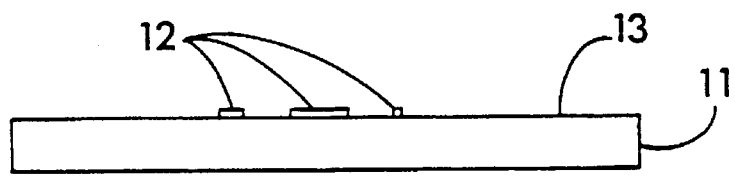
FIG. 1 is a simplified illustrative side view of a substrate with existing micromechanical structures formed thereon.

The present invention may be utilized in the formation of microstructures as carried out in LIGA processes and extensions thereof. Exemplary processes for carrying out the production of micromechanical metal structures is described in U.S. patent application Ser. No. 07/874,116 by Henry Guckel, filed Apr. 24, 1992, now U.S. Pat. No. 5,190,637, entitled Formation of Microstructures by Multiple Level Deep X-Ray Lithography With Sacrificial Metal Layers, the disclosure of which is incorporated herein by reference. The present invention may also be utilized for producing patterned photoresist which may be used for other applications, as where the photoresist is used directly for purposes unrelated to providing a mold for the electro-deposition of metal. The process allows the formation of thick photoresist structures which enjoy substantially no internal strain after adherence to the substrate, good adhesion to the substrate, and generally ready removability from the substrate without substantial additional processing, with-photoresist thicknesses up to 1,000 microns being readily achievable. Films cast directly onto a substrate in comparable thicknesses inevitably experience internal strain which detracts from the integrity of the films, increases the likelihood of poor adhesion to the substrate, and leads to crazing of the films. The present invention may be utilized with relatively thin layers of spun on film as part of a multiple layer structure, as described below, with the spun on film thicknesses typically being in the range of 5 μm or less, and in multilayer structures formed from two or more preformed photoresist sheets.

In the present invention, a preformed photoresist sheet, preferably one formed of linear (non-cross linked), high molecular weight (>2 million) polymethylmethacrylate (PMMA), may be adhered to a substrate before or after patterning in a manner which firmly bonds the preformed sheet to the substrate without introducing internal strain in the substrate. The preformed sheet may be commercially obtained, and generally will have little or no internal strain associated with it in its free form. As used herein, a strain free preformed photoresist will not substantially mechanically distort after portions of the photoresist are exposed and removed or when the remaining photoresist is released from the substrate. The preformed sheet is adhered to the surface of the chosen substrate utilizing a suitable adhesive. In the present invention, a preferred adhesive layer for use with a preformed PMMA sheet is a relatively thin spun on film of PMMA which is applied to the substrate in a conventional manner and cured and forms a strong bond to the substrate. Because the initial spun on film of PMMA is relatively thin (1 μm to 5 μm or less), the initial spun on film is not subject to the adhesion problems, internal strain problems, and crazing which is commonly associated with the much thicker (25 μm to 200 μm) films which are utilized in LIGA processing. Because the initial PMMA film layer will be covered by the preformed PMMA sheet, and is relatively thin, the initial PMMA layer will not suffer crazing during the electro-deposition process and does not need to have a cross-linking agent added to it to maintain the integrity of the film. Consequently, by using a non-crosslinked preformed PMMA sheet of high molecular weight PMMA, the entire photoresist may be readily removed using a suitable solvent after the patterning and deposition of the metal have occurred, without requiring a blanket exposure to X-rays or UV of the entire surface of the substrate on which the photoresist film is formed. This eliminates a time consuming and relatively expensive final step which has been heretofore an essential step in LIGA processing. Adhesion between the preformed PMMA sheet and the initial PMMA layer may be readily obtained by utilizing methylmethacrylate (MMA) monomer liquid applied to the interface between the preformed sheet and the initial layer. The monomer wicks through the interface between the two layers by capillary action, causing a bond between the preformed sheet and the initial layer, and is released by diffusion through the preformed sheet after a sufficient period of time. The preformed sheet adhered to the substrate may be mechanically worked, as by milling, to reduce the thickness of the layer to a precise height above the surface of the substrate, e.g., by using commercially available micromilling equipment.

After the photoresist has been applied and milled to the desired thickness, it may be patterned in a conventional manner, such as by using X-ray radiation from a synchrotron and an X-ray mask, to render areas of the photoresist susceptible to removal by a developer liquid. High molecular weight, linear PMMA exhibits good selectivity to conventional developers so that the unexposed PMMA is not substantially affected by the developer, while the exposed PMMA, which consists of PMMA molecules of substantially shorter length as a result of molecular chain scission from the radiation exposure, is readily dissolved by the developer.

Figure 2:
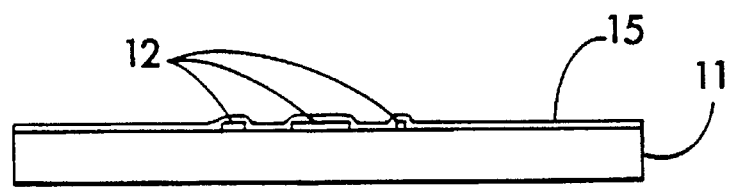
FIG. 2 is a view of the substrate of FIG. 1 with a coating of photoresist thereon.

The process can further be extended to the formation of additional microstructures on a substrate on which relatively thin microstructures have already been formed. The basic process and the extended process may both be illustrated with respect to the views of FIGS. 1–9. With reference to FIG. 1, a substrate 11, e.g., single crystal silicon, glass, quartz, etc., may have previously formed microstructures 12 thereon. These microstructures will typically be in the range of a few μm in thickness (e.g., 2.5 μm). In typical LIGA processing, a metal plating base 13 is formed on the top surface of the substrate 11 to provide a base for the structures 12 which are deposited by electroplating onto the plating base 13. The next step, as illustrated in FIG. 2, is the spinning on of a layer of liquid linear PMMA, e.g., 496 k molecular weight PMMA in a layer 15 on the surface of the substrate 11 (over the plating base 13) and over the microstructures 12.

Figure 3:
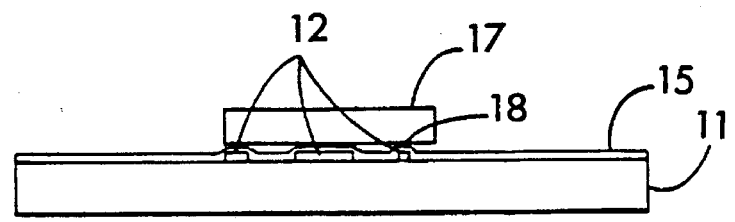
FIG. 3 is a view of the substrate of FIG. 2 with the addition of a preformed sheet of photoresist on top of the initial layer of photoresist.
Figure 4:
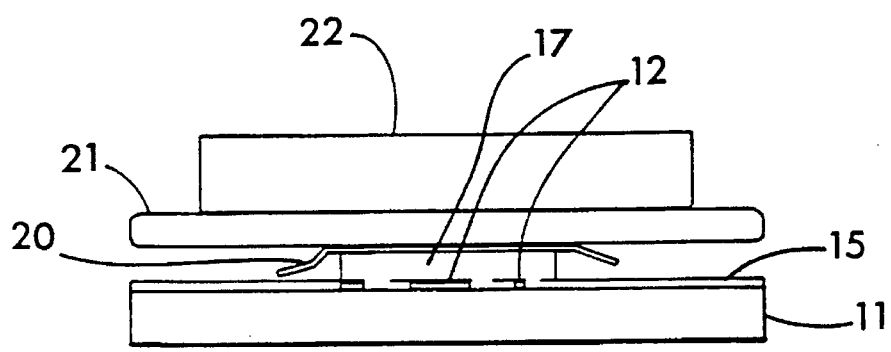
FIG. 4 is a view of the substrate of FIG. 3 illustrating the application of a monomer at the interface between the preformed sheet and the initial layer of photoresist, with a weight pressing the preformed sheet to the underlying layer.
Figure 5:
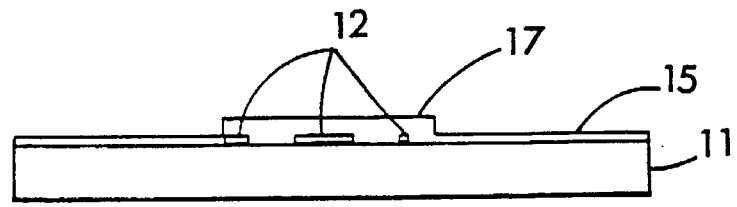
FIG. 5 is a view of the substrate of FIG. 4 after the preformed sheet is milled down to a desired thickness.

As illustrated in FIG. 3, a preformed photoresist sheet 17 of linear PMMA is then placed on top of the spun-on layer 15 of PMMA. The exposed interface 18 between the layer 15 and the preformed sheet 17 is then wetted with the monomer, in this case MMA, and the sheet 17 is pressed against the layer 15 in a suitable manner, for example, using a piece of aluminum foil 20, a layer of steel wool 21 and a mass 22 to provide a controlled, evenly distributed pressure to the preformed sheet 17. After a suitable period of time, the weights 21 and 22 and the foil 20 are removed, and the monomer is allowed to diffuse through the preformed sheet 17. Thereafter, the substrate is placed in a micromill and the layer 17 is milled down to a desired thickness at a selected height above the top surface of the substrate 11.

Figure 6:
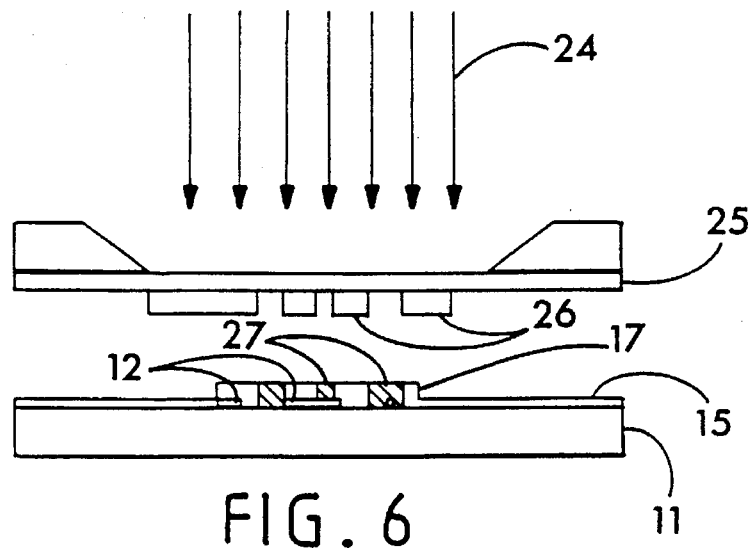
FIG. 6 is an illustrative view showing the photoresist and substrate of FIG. 5 exposed through an X-ray mask to X-ray radiation.
Figure 7:
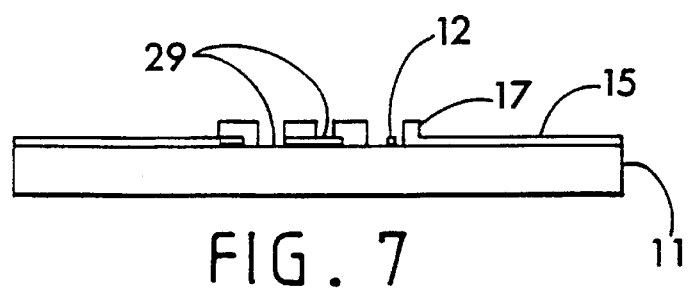
FIG. 7 is an illustrative view showing the substrate and photoresist of FIG. 6 after the exposed photoresist has been developed.
Figure 8:
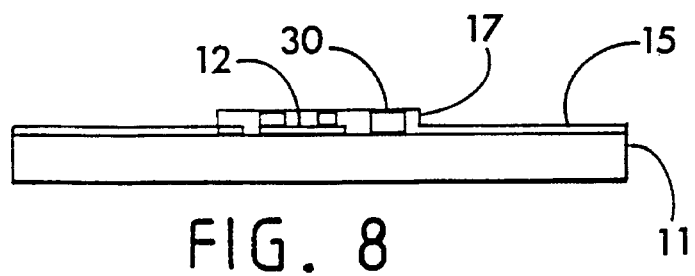
FIG. 8 is an illustrative view of the substrate of FIG. 7 after electroplating of metal into the areas from which the photoresist has been removed.
Figure 9:
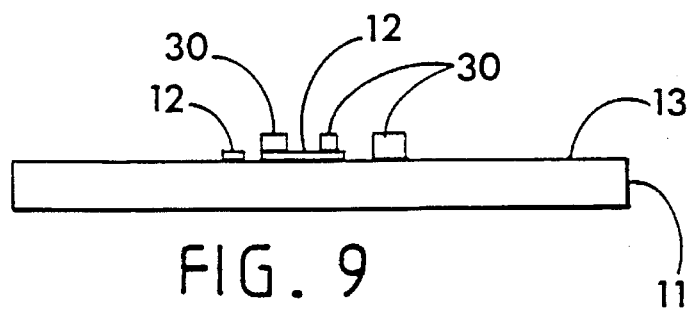
FIG. 9 is an illustrative view of the substrate with the micromechanical parts formed thereon after the remaining photoresist has been stripped from the substrate.

With reference to FIG. 6, the sheet 17 and the layer 15 are exposed in a pattern to X-rays 24 through an X-ray mask 25 having an X-ray absorber 26 thereon in a pattern. The X-rays, or in appropriate cases, UV radiation, which is passed by the mask is incident on areas 27 in the photoresist 17 and the underlying layer 15. These areas 27 experience chain scission of the high molecular weight material therein and thus become susceptible to removal by a developer. The resulting structure is illustrated in FIG. 7 where the exposed areas have been removed by a developer to leave openings 29 in the layer 17, some of which bottom out on the plating base 13 on the surface of the substrate 11, and others of which may expose all or part of the original microstructures 12 which were on the substrate. As illustrated in FIG. 8, metal is then electroplated into the openings 29 in a conventional manner to provide metal structures 30 on the substrate in addition to the original metal structures 12. The final step involves the removal of all the remaining photoresist, both the initial PMMA layer 15 as well as the remainder of the preformed sheet 17, to leave the free standing metal structures 12 and 30 on the surface of the substrate 11. The free standing structures 30 may be quite high, since they can be as high as the thickness of the milled photoresist sheet 17. Exemplary structures may be formed to a height of 200 μm to 300 μm or greater, allowing structures to be formed at thicknesses which were not heretofore readily obtainable using conventional LIGA processing techniques.

An X-ray sensitive preformed photoresist layer of 50 μm to 1000 μm or greater can be prepared on a variety of substrates. Because the present invention requires no heat cycles once the resist is attached, the thermal expansion mismatch between the thick resist layer and the substrate is negligible. The resulting resist layer has very good adhesion and very low internal stress.

Exemplary processing procedures in accordance with the invention are described below. These procedures use the following materials: adhesion promotor, APX-K1, from Brewer Science, Inc., P.O. Box GG, Rolla, Mo. 65401; liquid photoresist, 496 k PMMA photoresist, from OLIN HUNT/OCG, 3 Garret Mountain Plaza, West Paterson, N.J. 07424, comprising polymethylmethacrylate with molecular weight of 496,000 dissolved in chlorobenzene (9 wt %); preformed polymethylmethacrylate sheet, from Goodfellow, Suite 140, 301 Lindenwood Drive, Malvern, Pa. 19355-1758, comprising polymethylmethacrylate (PMMA) with weight average molecular weight greater than 2 million ($M_w/M_n$ approximately 2–3), not appreciably crosslinked; methyl methacrylate monomer, from Aldrich Chemical Company, Inc., 1001 West Saint Paul Avenue, Milwaukee, Wis. 53233.

Procedure for Preparing Thick PMMA Resist Layer on Smooth Metalized Surface

An initial step involves preparation of the substrate for formation of micromechanical structures. A typical substrate is a Si wafer, covered with about 1 μm $SiO_2$. A metal plating base is then applied. A typical base includes a first layer of 200 Å Ti, DC sputtered, followed by a second layer of 200 Å Ni, DC sputtered. The substrate is then removed from the sputter system, and the adhesion promoter, APX-K1, is spun-on at 3000 rpm, for 30 seconds, followed by a 30 second hotplate bake at 145° C. The use of the adhesion promotor is optional, and may be omitted in many applications. A layer of 496 k PMMA (9 wt %) is then spun-on at 2000 rpm for 60 seconds. The wafer is then subjected to a bake/anneal cycle: 60° C./hr to 180°C., 180° C. for 1 hour, then 60° C./hr to room temp.

The preformed PMMA sheet (e.g., ½"×¾") is then placed near the center of substrate. Using a micropiper, 10 μl of methyl methacrylate is introduced to the edge of the sheet to be glued-down. The interface is wet with the methyl methacrylate as a result of capillary action.

The sample is then covered with aluminum foil and lightly weighted using a ½" thick piece of steel wool (wrapped with aluminum foil) and a weight of approximately 1 kg. The sample should remain covered for at least 1 hour, after which the weights and aluminum foil can be removed and the sample stored in a vented wafer box (preferably $N_2$ purged).

To avoid cracking of the film during or shortly after milling, the monomer should be allowed to diffuse and evaporate from the film for a minimum of 8 hrs. Following the 8 hour drying period, the sample may be milled to the desired thickness. The PMMA photoresist formed in the foregoing manner is both deep UV and X-ray sensitive, and is compatible with the remaining steps of conventional LIGA processing. The thick resist layer may be removed through immersion in methylene chloride.

Procedure for Preparing Thick PMMA Resist Layer on Non-Planar Substrate

For substrates having existing structures thereon, the following is an exemplary process. A typical substrate may be a 3" Si wafer with metal structures of about 2.5 μm step heights.

First, the adhesion promoter, APX-K1, is optionally spun-on at, e.g., 3000 rpm, for 30 seconds, followed by a 145° C., 30 second hotplate bake. Then, 496 k PMMA (9 wt %) is spun-on, with a 10 second delay prior to spinning, at 2000 rpm, for 30 seconds. A bake/anneal cycle follows: 60° C./hr to 180° C., 180° C. for 1 hour, then 60° C./hr to room temperature. Another 496 k PMMA (9 wt %) layer is spun-on, with a 10 sec delay prior to spinning, at 2000 rpm, for 30 seconds. A bake/anneal cycle as above follows.

The preformed photoresist sheet is then adhered to the 496 k PMMA layer as described above. Preformed photoresist sheets with thicknesses of 1 mm are commercially available and readily handled. After being adhered to the substrate as described above, the preformed layer may be milled to a desired thickness (to within ±2.5 μm) with surface finish of less than ±0.1 μm, using a fly cutter with either a diamond or a CBN (cubic boron nitride) tool. An example of a suitable milling machine is a Jung/Reichert polycut E ultramiller. The resist layer obtained has very good adhesion and appears to have very low internal stress. Removal of this thick resist does not require a blanket exposure. Since the resist is composed of linear polymethylmethacrylate, removal may be accomplished through dissolution in a suitable solvent. To prevent excessive swelling and cracking of the resist, which could damage adjacent, delicate metal structures, methylene chloride is generally suitable as the solvent. To clear 200 μm to 300 μm of resist, the sample is immersed in 200 ml of $CH_2Cl_2$ for 20 to 30 minutes, then again into 100 ml $CH_2Cl_2$ to rinse. An oxygen plasma may also be employed as a final clean.

Procedure For Preparing Released PMMA Photoresist Structures

Figure 10:
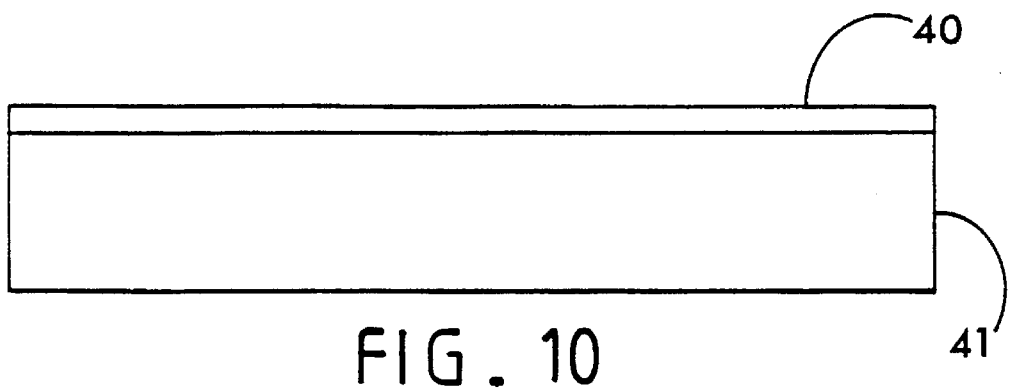
FIG. 10 is a simplified illustrative side view of a substrate with a sacrificial layer formed thereon.

Free structures formed of photoresist, such as PMMA, may also be formed in accordance with the present invention. The process for producing such structures is illustrated with respect to FIGS. 10–14. Referring initially to FIG. 10, the process begins with the application of a thin sacrificial layer 40 onto a substrate 41. The substrate typically has a planar surface on which the sacrificial layer 40 is formed, and may be made of a variety of materials, e.g., a silicon wafer, glass, metal, or various plastics. The material of the sacrificial layer may be any of a variety of materials which is resistant to attack from the photoresist developer. For example, where the photoresist is PMMA, the sacrificial layer of material must be resistant to a typical PMMA developer such as morpholine, 2-(2-butoxyethoxy) ethanol, ethanolamine, and water. The sacrificial layer of material must also be selectively removable by a remover which does not attack the photoresist, e.g., PMMA. For a PMMA photoresist, examples of suitable sacrificial layers are titanium (sputtered on to the substrate), which can be removed with dilute hydrofluoric acid, and partially imidized polyimide (which is spun on the substrate), with a suitable remover for the polyimide being ammonium hydroxide. A soft PIRL polyimide material available from Brewer Science can be utilized as the sacrificial layer, as described in the aforesaid U.S. Pat. No. 5,190,637, the disclosure of which is incorporated herein by reference.

Figure 11:
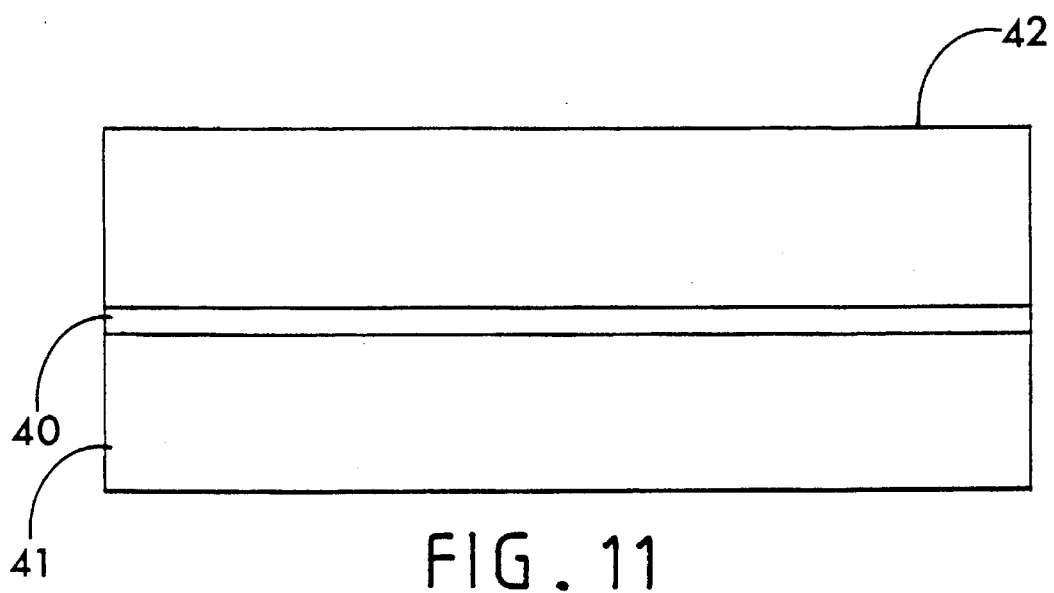
FIG. 11 is a view of the substrate of FIG. 10 with a strain free photoresist sheet adhered to the sacrificial layer and thus to the substrate.

As illustrated in FIG. 11, the preformed strain-free photoresist sheet, for example, the preferred PMMA sheet described above, is then adhered as a layer 42 to the sacrificial layer 40 in the manner described above. The layer may be milled down as described above to reach a desired thickness less than the initial sheet thickness.

Figure 12:
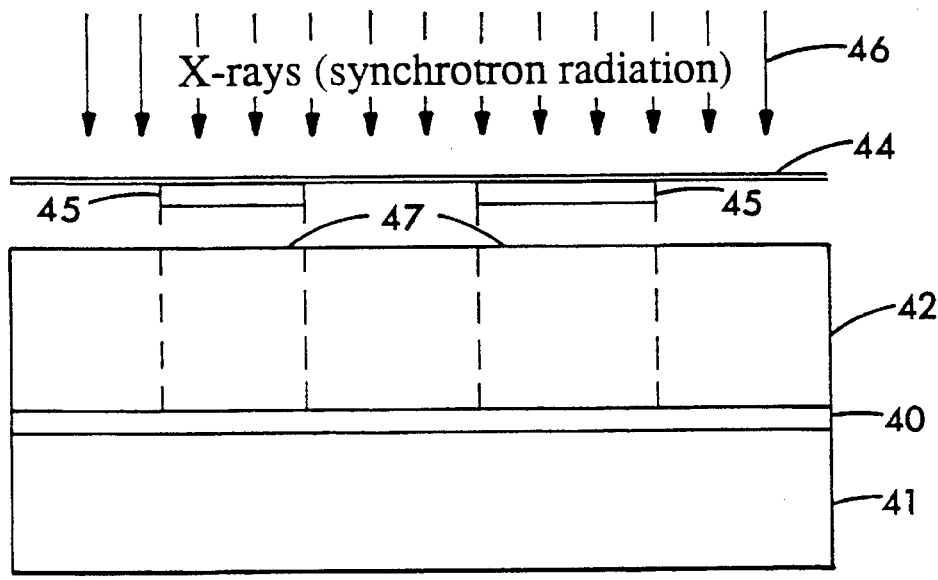
FIG. 12 is an illustrative view showing the photoresist and substrate of FIG. 11 exposed through an X-ray mask to X-ray radiation.
Figure 13:
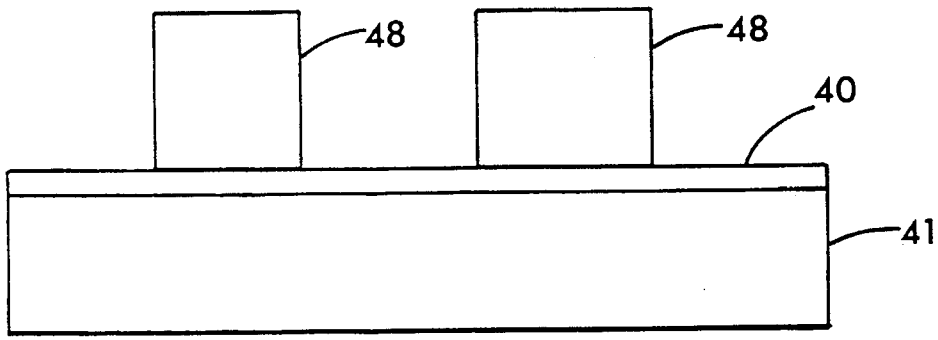
FIG. 13 is an illustrative view showing the substrate and photoresist of FIG. 12 after the exposed photoresist has been developed.
Figure 14:
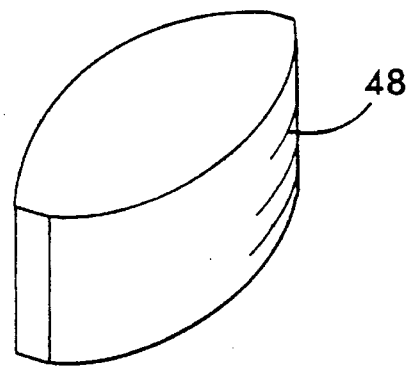
FIG. 14 is a perspective view of an exemplary free part formed of photoresist material which may be formed in accordance with the invention.

As illustrated in FIG. 12, an X-ray mask 44 having X-ray absorbing patterns 45 formed thereon provides a pattern exposure from synchrotron radiation X-rays 46 to provide exposed patterns 47 in the photoresist sheet 42. The exposed photoresist is then developed using a high selectivity developer, as described above, to remove the exposed photoresist 47, leaving, in the exemplary structure of FIG. 13, isolated photoresist structures 48 adhered to the sacrificial layer 40. A remover of the sacrificial layer is then applied to the sacrificial layer in the substrate to selectively etch away the sacrificial layer 40, thereby freeing the structures 48 from the substrate. An example is shown in FIG. 14 of a free part which has the form of a lens, which, as shown in FIG. 14, has a body with sidewalls substantially perpendicular to the top and bottom surfaces of the body. By using the processes described above, these structures may be formed with at least one of the top or bottom surfaces of the body being milled, and with the thickness of the body between the top and bottom surfaces typically being less than about 1 mm. Where PMMA is utilized as the photoresist, a structure formed in this manner may have useful optical properties inasmuch as the PMMA is a substantially transparent material and thus is well suited for use as a lens. Of course, many other types of structures may be formed in this manner which can be separated from the substrate. In addition, the PMMA structures 48 remaining on the sacrificial layer may be interconnected, having patterned openings therein, which, when removed from the sacrificial layer, may be utilized as molds for molding of other parts. A separated PMMA sheet with holes of desired size formed therein may also be utilized as a filter or sieve having desired flow properties through the openings formed in this manner. If desired, the initial PMMA sheet may be cross-linked so that the completed parts are also of cross-linked PMMA.

Because the preformed photoresist sheet is substantially strain-free, when the parts 48 are freed from the substrate upon removal of the sacrificial layer, the parts have substantially no internal strain therein and will not substantially mechanically distort or curl, as is commonly the case with photoresist materials, such as PMMA, which are applied in liquid form to a substrate and cured to solidify the photoresist.

Formation of Multilayer Photoresist Structures

In accordance with the present invention, multilayer photoresist structures comprising laminates of two or more preformed photoresist sheets, or a cast layer and one or more preformed sheets, can be produced for use either as forms for producing three dimensional metallic parts of a desired geometry, or for their own utility as structural components. Such structures are obtained utilizing the foregoing procedures in accordance with the invention. A variety of process sequences are possible to obtain such multilayer structures.

Figure 15:
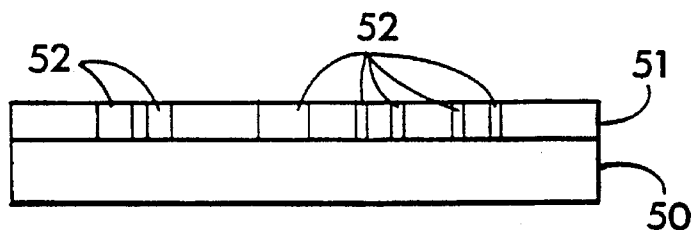
FIG. 15 is an illustrative side view of a substrate having a preformed photoresist sheet thereon which has been exposed and machined but with the exposed regions not yet developed.
Figure 16:
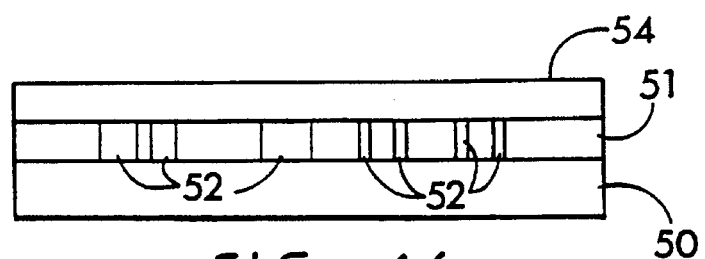
FIG. 16 is an illustrative view of the substrate of FIG. 15 after a second preformed photoresist layer is bonded onto the first layer and machined to a desired thickness.
Figure 17:
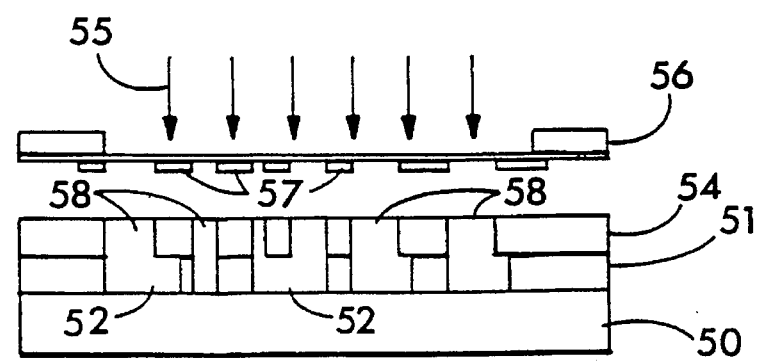
FIG. 17 is an illustrative view showing the substrate and photoresist layers of FIG. 16 exposed through an X-ray mask to X-ray radiation.
Figure 18:
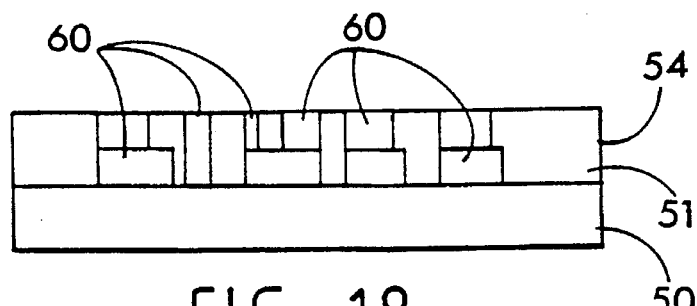
FIG. 18 is an illustrative view of the substrate and photoresist of FIG. 17 after the exposed photoresist has been developed.

In a first exemplary process sequence, illustrated in FIGS. 15–18, a substrate 50 has a layer 51 of photoresist formed thereon which has exposed regions 52. The photoresist layer 51 may constitute a preformed photoresist sheet exposed and machined as described above. However, if desired, the initial layer 51 may be formed in a more conventional manner as a cast layer of, e.g., PMMA, which is cured and cross-linked and exposed in a pattern to X-rays. Next, as illustrated in FIG. 15, a preformed photoresist sheet 54 (e.g., linear PMMA as described above) is then bonded to the first layer 51 and machined down to a desired thickness. As illustrated in FIG. 17, X-rays 55 are passed through an X-ray mask 56 having X-ray absorbing material 57 in a pattern thereon to expose regions 58 in the second layer 54. The regions 58 may lie entirely within underlying areas 52 so that only these previously exposed regions 52 receive X-rays during the exposure of the second layer 54. Alternatively, the thicknesses of the layers 51 and 54, and the length and intensity of the exposure of the X-rays 55, may be selected so that X-rays passed through the mask 56 penetrate entirely through both the layers 54 and 51 to fully expose the regions underlying the open areas of the mask 56 in both of the layers 51 and 54. The latter case is illustrated in FIG. 17 where the X-rays 55 expose additional regions of the first layer 51 beyond the original exposed regions 52. Of course, it is understood that the mask 56 is two dimensional, and there may be and generally will be some areas of the regions 52 which will not receive any X-ray exposure from the X-rays and some areas of the first layer 51 where the X-rays 55 will not extend beyond the previously exposed regions 52.

The foregoing process can be repeated for as many layers as desired even though only two are shown in FIG. 17. When exposure of the last layer is completed, the photoresist in the exposed regions can then be removed by applying liquid developer to the photoresist to leave void regions 60 into which metal may be electroplated in the manner described above. The multiple layers 51 and 54 which form a laminate on the substrate 50 may then be removed, if desired, in the manner described above. Generally, the regions 58 in the second layer (or subsequent layers) should overlap at least in part all underlying void regions 52 in the first layer 51 so that the developer liquid can reach the regions 52 in the first layer. When all of the exposed photoresist is removed, voids 60 are left in the multilayer laminate.

Each of the layers 51 and 54 (and additional layers) may be formed from a typical commercially available photoresist sheet, which is commonly in the 1 mm to 3 mm thickness range, formed of a high molecular weight X-ray sensitive material e.g., PMMA as described above. The bonding of a preformed sheet to an underlying surface of a photoresist sheet may be accomplished by solvent bonding as described above, using methyl methacrylate (MMA) which wets the interface between the two adjoining sheets, but other bonding techniques which do not substantially damage the structural integrity of the photoresist sheets are also acceptable. Where the photoresist sheets are linear or relatively low molecular weight PMMA, the MMA monomer will generally provide adequate solvent bonding of the two sheets. If a highly cross-linked PMMA sheet is to be adhered on an underlying cross-linked PMMA sheet, a procedure as described above for adhering a PMMA sheet to a general substrate may be used. For example, a layer of relatively low molecular weight PMMA (e.g., 496 k PMMA) in a solvent may be spun on in a thin layer and cured. The MMA monomer can act on the low molecular weight PMMA layer to provide solvent bonding between that layer and the highly cross-linked PMMA sheet. The low molecular weight PMMA layer is also sensitive to X-ray exposure and will be patterned in the same way as the preformed PMMA sheet.

Figure 19:
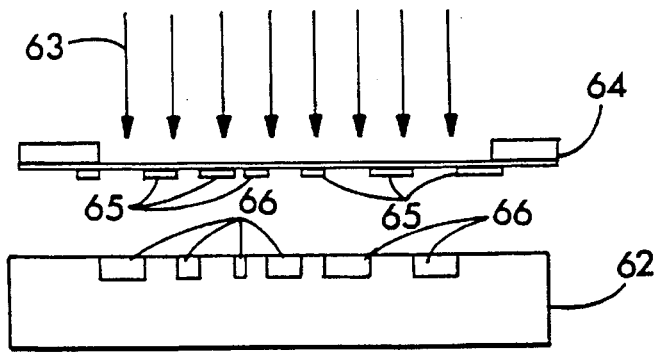
FIG. 19 is an illustrative side view of a relatively thick preformed sheet of photoresist exposed through an X-ray mask to X-ray radiation.

Another multiple layer process sequence is illustrated in FIGS. 19–23. As illustrated in FIG. 19, a fairly thick sheet of preformed photoresist 62 (e.g., 1 mm to 3 mm PMMA) is exposed to X-rays 63 through an X-ray mask 64 having X-ray absorber 65 formed thereon in a pattern. The regions 66 which are exposed to the X-rays passed through the mask 64 receive a sufficient X-ray exposure to render these areas susceptible to a photoresist developer. However, in this case, the photoresist sheet 62 is sufficiently thick that the regions 66, which are sufficiently exposed to the X-rays so as to render these areas susceptible to a developer, extend only partially through the thickness of the photoresist sheet 62. For example, the depth of the region 66 may only be a few hundred microns or less where the entire sheet 62 may have a thickness of 1,000 microns (1 mm) or more.

Figure 20:
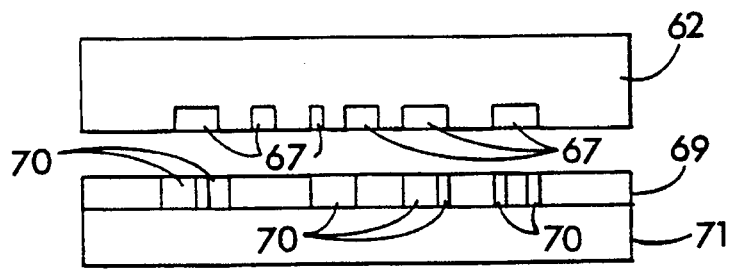
FIG. 20 is an illustrative view showing the photoresist sheet of FIG. 19, after exposure and development of the exposed photoresist, which is positioned to have its exposed surface bonded to a previously developed photoresist sheet on a substrate.
Figure 21:
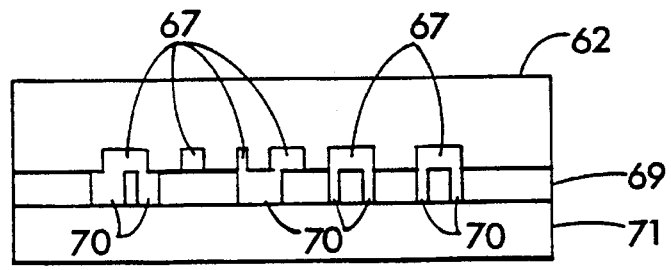
FIG. 21 is an illustrative view showing the free photoresist sheet bonded to an underlying layer of photoresist with alignment of the developed regions in the two layers of photoresist.
Figure 22:
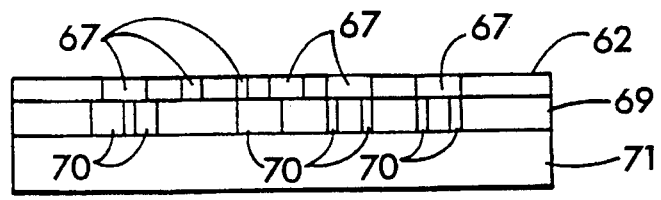
FIG. 22 is an illustrative view of the substrate and photoresist layers of FIG. 21 after machining of the top layer down to a thickness such that all of the developed regions in the second photoresist sheet are exposed.
Figure 23:
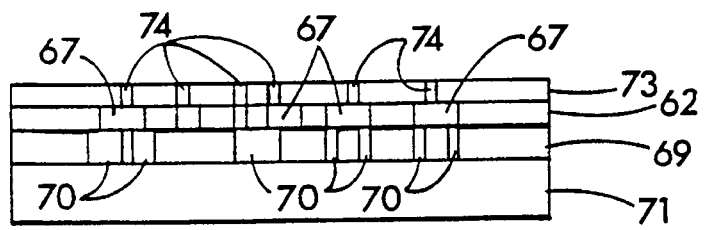
FIG. 23 is an illustrative view of the substrate and photoresist layers of FIG. 22 with the addition of a third layer of photoresist which may be formed in the same manner as illustrated above in FIGS. 19–22.

After the preformed photoresist sheet 62 is exposed to X-rays, the sheet has a liquid developer applied to it which removes the photoresist in the regions 66 to leave open regions 67, as illustrated in FIG. 20. The preformed sheet 62 is then joined with a previously formed layer 69 of photoresist having developed areas 70, with the layer 69 being mounted on a substrate 71. The layer 69 can be formed on the substrate 71 in any of the various ways described above (e.g., casting liquid PMMA or the use of a preformed photoresist). The preformed photoresist sheet 62 is then aligned with the underlying photoresist layer 69 and bonded to the surface of that layer so that the void regions 67 in the second layer preformed sheet 62 align with the void regions 70 in the first layer 69. Thereafter, as illustrated in FIG. 22, the photoresist sheet 62 is machined down to a thickness which is less than the height of the regions 67 above the surface of the sheet 62, fully opening up the regions 67 and allowing communication to the underlying regions 70 in the first photoresist layer 69. The foregoing process can be repeated as many times as desired to build up a multilayer laminate, as illustrated in FIG. 23 in which a third photoresist layer 73 having open regions 74 is bonded to the second photoresist layer 62. The geometry of the openings in the laminate, defined by the open regions 70, 67 and 74 in the three layers, can be relatively arbitrary. These regions can then be filled with metal by electrodeposition as described above. When the multiple layers 73, 62 and 69 are removed (e.g., with a blanket developer as described above), metal structures remain on the substrate 71 which can have a variety of three dimensional shapes of substantially arbitrary geometry.

It should also be understood that in the process of FIGS. 19–23, the preformed and developed sheet 62 may be adhered as described above to any other suitable substrate; i.e., the substrate 71 and first layer 69 effectively comprise a "substrate" to which subsequent layers of photoresist may be adhered. The process is general. For example, the substrate may comprise a wafer of silicon on which microcircuits are formed in conventional semiconductor processing techniques. The developed photoresist sheet 62 may be adhered to the silicon substrate to cover the circuitry thereon. Because the photoresist sheet 62 has been exposed to X-rays separately before it is attached to the substrate, no X-ray exposure of the substrate is required and damage to circuitry on the substrate is avoided. The layer 62 may be machined down to expose the voids 67, which can allow access to portions of the circuitry thereunder. For example, the voids 67 may be chosen to align to electrical connecting pads for an integrated circuit on the substrate, with conducting metal being electroplated into the voids to provide upright connections to these conducting pads. If desired, the photoresist may then be removed as described above, or it may be left on the integrated circuit to protect it. PMMA is an advantageous material for such purposes since it is generally transparent and may be used to cover optically active devices on the substrate.

Figure 24:
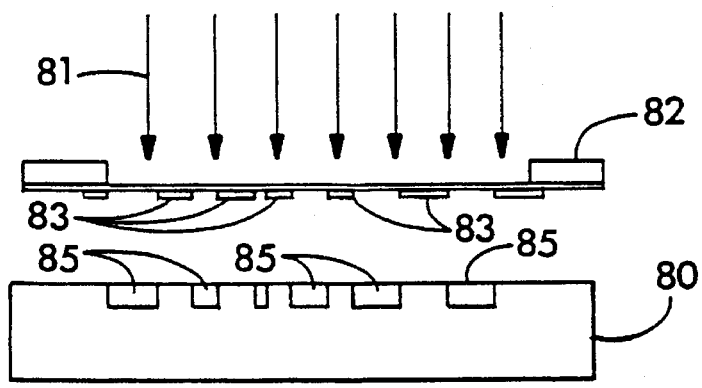
FIG. 24 is an illustrative side view of a relatively thick preformed photoresist sheet exposed through an X-ray mask to X-ray radiation.
Figure 25:
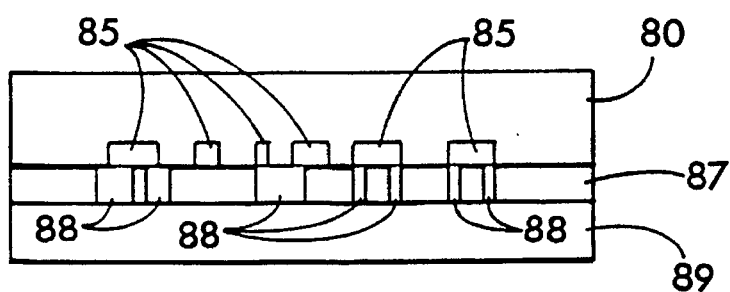
FIG. 25 is an illustrative side view of the exposed but not developed photoresist sheet of FIG. 24 which is bonded to a layer of exposed but not developed photoresist on a substrate.
Figure 26:
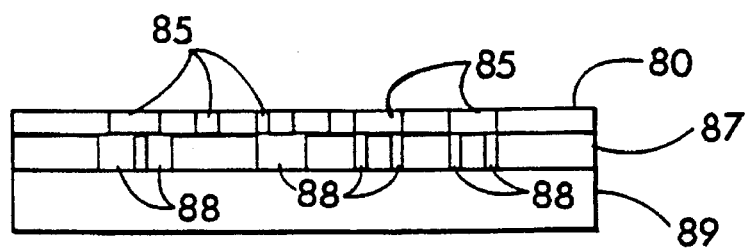
FIG. 26 is an illustrative side view of the substrate and photoresist layers of FIG. 25 after the top layer of photoresist is machined down to a thickness such that all of the fully exposed regions of photoresist in the top layer are exposed.
Figure 27:
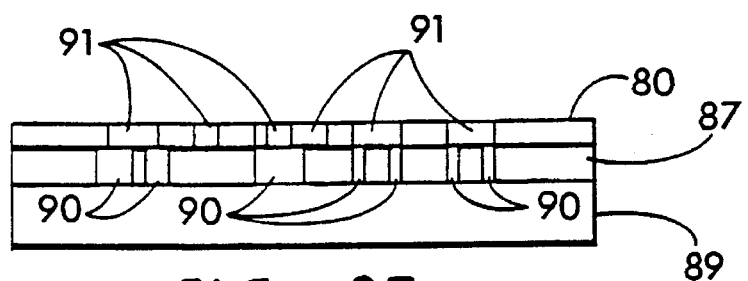
FIG. 27 is an illustrative view of the substrate with photoresist layers of FIG. 26 after development and removal of the exposed photoresist.

In a variation of the foregoing process sequence, a relatively thick sheet of photoresist 80 is exposed to X-rays 81 through an X-ray mask 82 having X-ray absorber material 83 in a pattern thereon to define regions 85 in the side of the photoresist sheet 80 which are exposed to X-rays and which are susceptible to being removed by a developer, as illustrated in FIG. 24. However, rather than removing the photoresist in the regions 85 immediately by applying a developer, the photoresist sheet is adhered at its exposed side to a first photoresist layer 87, having regions 88 therein that have been exposed to X-rays and are susceptible to a developer, with the first layer 87 being adhered to a substrate 89, as illustrated in FIG. 25. Thence, as shown in FIG. 26, the second layer 80 is machined down until it is of a thickness such that the X-ray exposed regions 85 are reached and fully exposed at the free surface of the layer 80. This process may be repeated to form a photoresist laminate of as many layers as desired. After the desired number of layers is reached, the entire structure is exposed to a developer which removes all of the exposed photoresist. This is illustrated in FIG. 27 for the two layer structure in which the photoresist has been removed from the regions 88 in the first layer 87 to leave open regions 90, and from the regions 85 in the second layer 80 to leave for open regions 91. The regions 85 and 88 generally must be in contact with each other to allow the developer liquid to reach the regions 88, or, alternatively, the regions 88 must be exposed at a side edge of the laminated structure so that the developer can reach these regions from this side edge. Generally, it is preferred that the regions 85 and 88 overlap each other to provide good removal of the exposed photoresist by the developer. If the structure illustrated in FIG. 27 is not the final product that is desired, but rather it is desired to use it as a mold to form metal structures, metal can be electroplated into the open regions 90 and 91 in the manner described above, and the layers 80 and 87 of photoresist can then be removed to leave the metal structures on the substrate.

Figure 28:
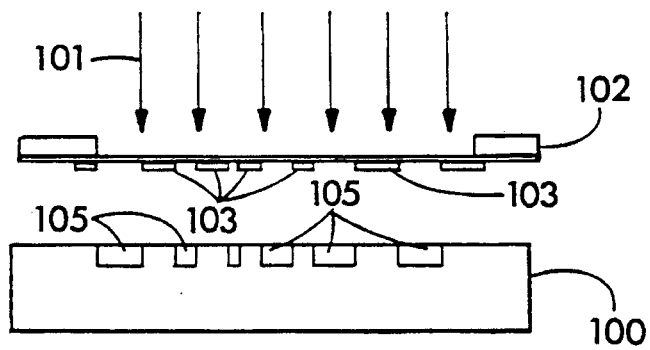
FIG. 28 is an illustrative side view of a relatively thick preformed photoresist sheet exposed through an X-ray mask to X-ray radiation.
Figure 29:
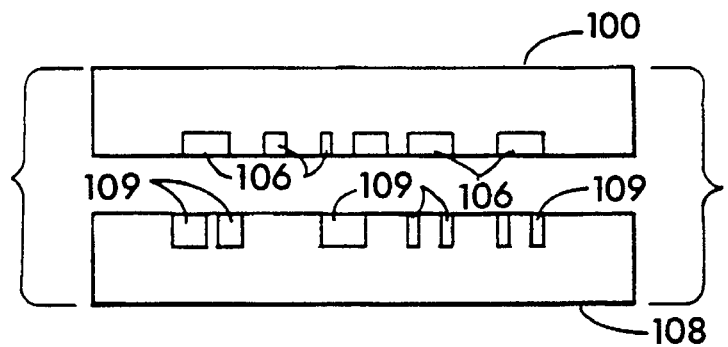
FIG. 29 is an illustrative view of two relatively thick preformed photoresist sheets which are exposed to X-rays in the manner illustrated in FIG. 28 and which have been developed to remove the exposed photoresist.
Figure 30:
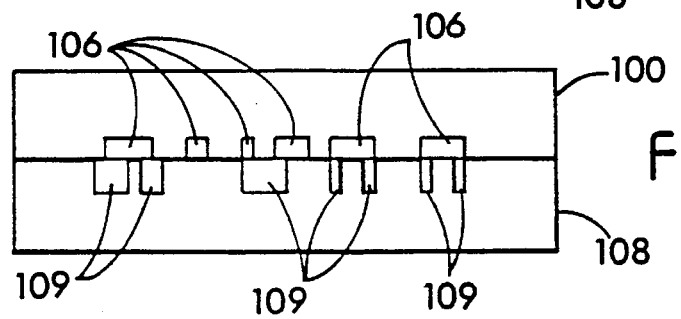
FIG. 30 is an illustrative view showing the two layers of preformed, exposed and developed photoresist sheet of FIG. 29 bonded together at their exposed surfaces.
Figure 31:
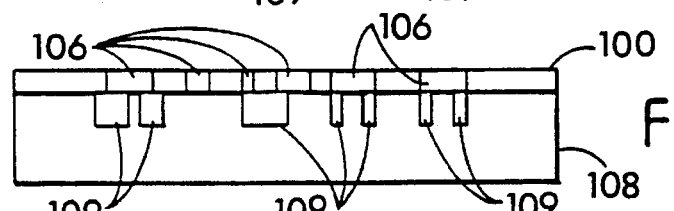
FIG. 31 is an illustrative view of the photoresist layers of FIG. 30 after the top layer has been machined down to a thickness which fully exposes the developed regions of the top photoresist layer.
Figure 32:
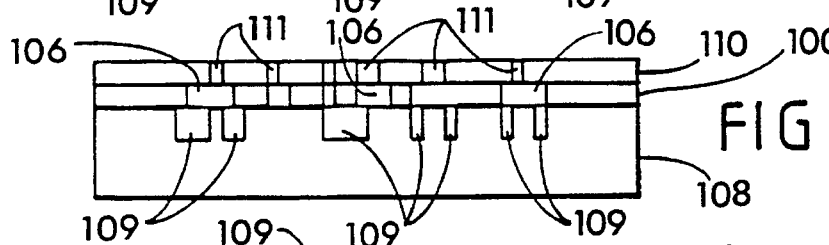
FIG. 32 is an illustrative view of the photoresist layers of FIG. 31 with the addition of another photoresist layer which is formed in the manner illustrated above with respect to FIGS. 28–31.
Figure 33:
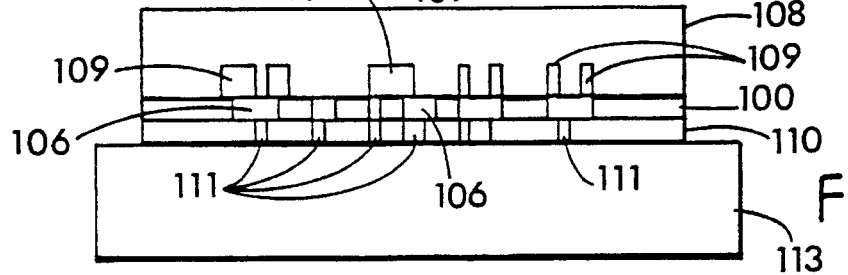
FIG. 33 is an illustrative view of the multilayer photoresist laminate of FIG. 32 with the free surface of the top layer bonded to a substrate and before machining down of the thick photoresist layer.

Either of the two foregoing process sequences can be carried out utilizing a preformed photoresist sheet having X-ray exposed areas therein as the substrate. The preformed photoresist sheets in normal thicknesses (1–3 mm, or even greater as desired) are sufficiently strong and have sufficient structural integrity to allow such sheets to be used as substrates on which one or more layers of photoresist are formed and machined. An exemplary process sequence (similar to the sequence of FIGS. 19–23) is shown in FIGS. 28–33. However, it should be understood that an essentially identical process can be carried out using the sequence of steps as in FIGS. 24–27, wherein the exposed photoresist is removed after all of the photoresist layers have been adhered together in the laminate. Referring to FIG. 28, a relatively thick preformed photoresist sheet 100 is exposed to X-rays 101 passed through an X-ray mask 102 having X-ray absorber 103 thereon in patterns which result in regions 105 in the preformed sheet 100 which are sufficiently exposed to X-rays to be removed by developer, but with the regions 105 extending only part way through the thickness of the photoresist sheet 100. The photoresist sheet 100 is then exposed to a liquid developer which removes the exposed photoresist in the regions 105. Another photoresist sheet 108 is formed by a similar process to have void regions 109 therein. The two relatively thick photoresist sheets 100 and 108 are then bonded together at their exposed surfaces in a properly aligned manner so that the void regions 106 and 109 properly align with each other, as illustrated in FIG. 30. The layer 100 may then be machined down to a thickness wherein the regions 106 are fully exposed, as illustrated in FIG. 31. A further photoresist sheet 110 having open regions 111 therein may be formed on the two layers 100 and 108 in an entirely identical manner. After the desired number of layers are formed in the laminate, the laminate may, if desired, then be bonded to a substrate 113 which has a surface thereon appropriate for electrodeposition of metal, as illustrated in FIG. 33. The now top layer photoresist sheet 108 may then be machined down to a thickness which exposes the open regions 109, allowing electrodeposition of metal into all of the regions 109, 106 and 111.

However, it should be understood that the laminate of layers 108, 100 and 110 of photoresist may itself have independent utility without being bonded to a substrate as a mold for electrodeposition. For example, the open regions 106, 109 and 111 may comprise multiple fluid channels to allow routing of liquids or gases through the laminate for use in pressure sensors, alarm devices, hydraulic or pneumatic actuators, etc. The channels formed by such open regions may be sealed off in the laminate structure of FIG. 32 by simply attaching another layer of photoresist to the exposed surface of the laminate. In essence, such a structure is shown in FIG. 33 in which the substrate 113 may simply serve the purpose of closing off the open regions 111, and may, if desired, be formed of any of a variety of materials, including a preformed photoresist sheet, or metal, or ceramic materials. Further, it is seen that the structure of FIG. 30 allows multiple channel structures to be formed with only two layers without machining of either layer when properly joined and aligned so that the open regions 106 and 109 are properly positioned with respect to each other.

Although the invention has been exemplified above with PMMA sheets, a positive photoresist, it is understood that the invention can also be carried out using a negative photoresist in which exposure to radiation renders the material less susceptible to a developer.

The joining together of two or more separately formed layers of photoresist, which have either void regions or regions exposed to X-rays therein, such that these regions are in proper alignment to each other, requires reasonably precise alignment of each layer. Generally, it is desired to be able to maintain tolerances to a micron or less. The use of a relatively thick photoresist can contribute to large alignment gaps. Relatively precise alignment and clamping procedures are required. Commercially available equipment for optical alignment of X-ray masks may be utilized to align the multiple layers, but such equipment is relatively expensive.

Alignment of the various exposed photoresist layers can be obtained by creating mechanical alignment structures during exposure of each layer and then using these alignment structures to obtain mechanical registration between each layer and a subsequent layer. Exemplary alignment structures can consist of relatively large (e.g., 1 mm diameter) holes on opposite sides of the exposure area which can accept pegs which may be formed of a photoresist material itself (e.g., PMMA) or metal. Alignment is established by assembling the subsequent layer onto the pegs and gluing of the photoresist sheet to the underlying layer. Self-alignment is obtained because the alignment holes are exposed at the same time as the desired pattern in the layer, and therefore the alignment tolerance is governed by assembly tolerances.

Figure 34:
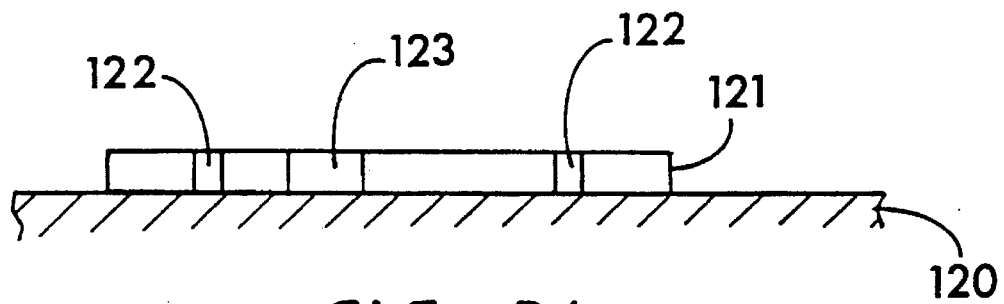
FIG. 34 is an illustrative side view of portions of a photoresist layer, on a substrate to illustrate the formation of alignment holes in the photoresist layer.

The alignment procedure is illustrated in the views of FIGS. 34–41. With reference to FIG. 34, a substrate 120 is shown having a first layer 121 of photoresist formed on it (in any manner) which has alignment openings 122 formed therein (e.g., cylindrical openings) and void regions 123 which constitute the desired structural openings. The exposure and masking processes that are carried out to form the openings 122 and 123 are as described above so that the openings 122 and 123 are formed at the same time; therefore, the relatively position of the openings 122 with respect to the openings 123 is precisely controlled. The substrate 120 may have a metallic plating base if desired.

Figure 35:
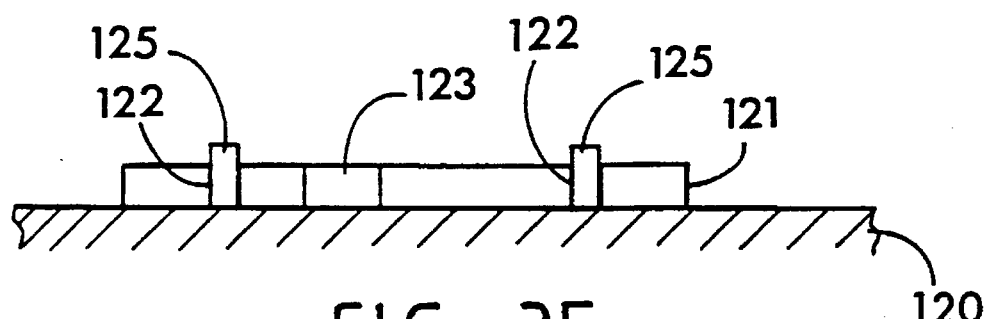
FIG. 35 is an illustrative view of the substrate with photoresist structure of FIG. 34 with alignment pegs inserted in the alignment holes.
Figure 36:
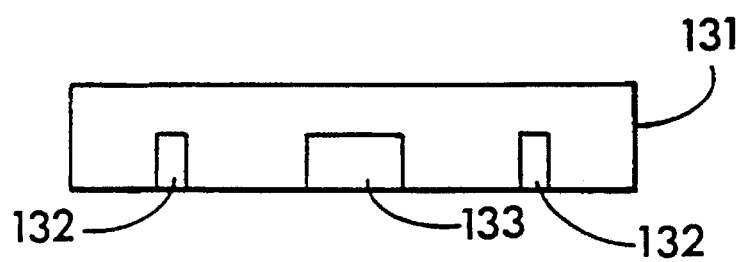
FIG. 36 is an illustrative side view of a relatively thick preformed photoresist sheet which has been exposed on one surface to X-ray radiation and developed to remove exposed photoresist in various regions, including regions which are sized and positioned to constitute alignment holes.
Figure 37:
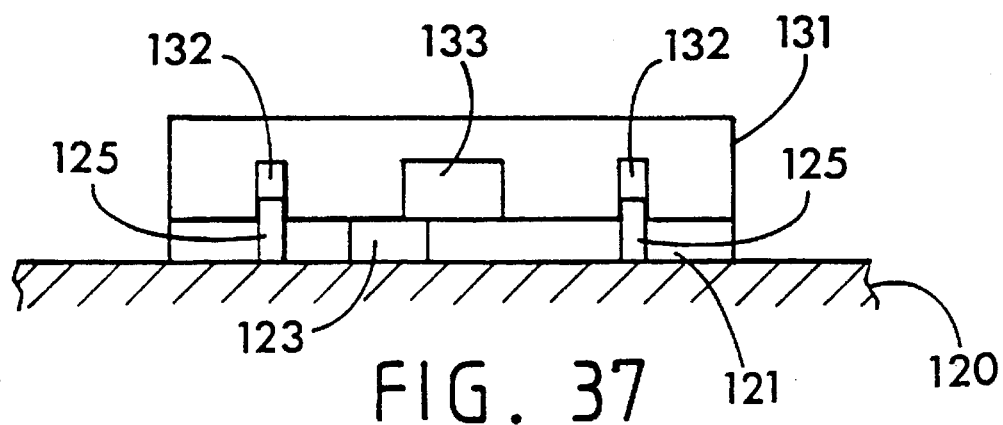
FIG. 37 is an illustrative view showing the preformed photoresist sheet of FIG. 36 drawn into alignment with the structure of FIG. 35 by insertion of the alignment pegs in the alignment holes of the preformed photoresist sheet.

Alignment pegs 125 are then inserted in the openings 122 as illustrated in FIG. 35. These pegs can be formed of metal by various techniques (they are relatively large, e.g., 1 mm in diameter) or the pegs can be made of the material of the photoresist, such as PMMA, which may be formed as free structures in the manner as described above with respect to FIGS. 12–14. A second layer of preformed photoresist sheet 131 is then formed as shown in FIG. 36, having alignment openings 132 and structural void regions 133 therein which extend partially through, but not necessarily entirely through, the relatively thick (e.g., 1 mm PMMA film) photoresist sheet. The second layer photoresist sheet 131 is then aligned with the first sheet by inserting the portions of the pegs 125 that protrude above the exposed surface of the first layer 122 into the alignment openings 132 in the second layer 131. Again, the control of the relative position of the alignment openings 132 to the structural void regions 133 insures that the structure area 133 is now properly aligned with the structural void regions 123 in the first layer 121.

Figure 38:
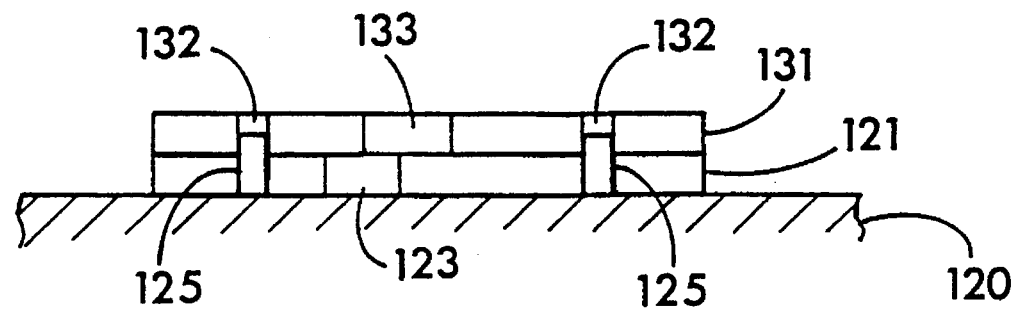
FIG. 38 is an illustrative view of the substrate and photoresist layers of FIG. 37 after machining of the top layer of photoresist down to a thickness which exposes the alignment holes and the other exposed regions in the top layer.
Figure 39:
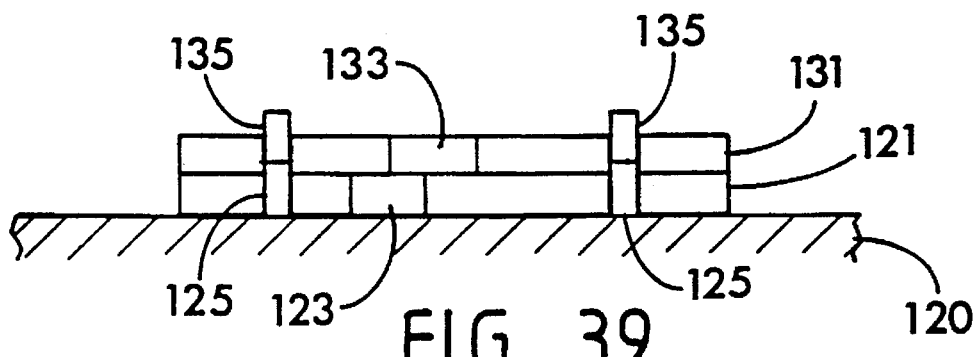
FIG. 39 is an illustrative view of the insertion of additional alignment pegs into the alignment holes left in the top layer of the photoresist sheet of FIG. 38.
Figure 40:
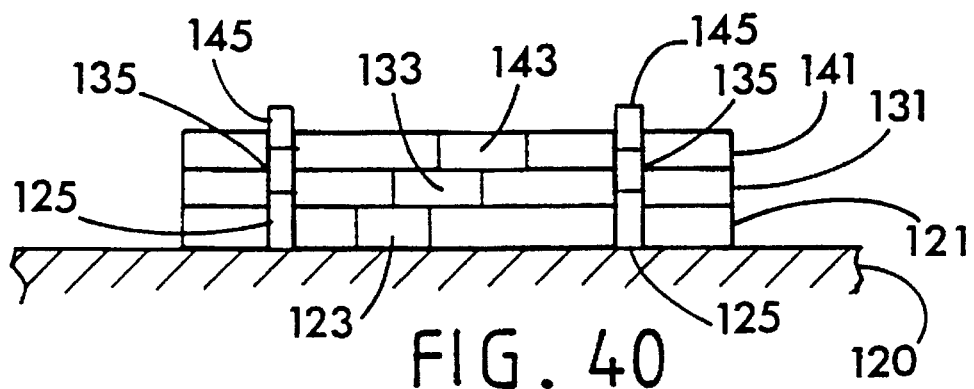
FIG. 40 is an illustrative view of the structure of FIG. 39 with the addition of a third layer of photoresist sheet and a third set of alignment pegs which are formed in the same manner as described above.

As illustrated in FIG. 38, the photoresist sheet 131 may then be machined down to a thickness such that the void regions 133 and the alignment openings 132 are fully exposed. However, the reduction in thickness of the second layer 131 preferably does not reduce it to a thickness such that the pegs 125 are exposed. Rather, a portion of each of the alignment openings 132 remains open, as illustrated in FIG. 38. Into the remaining portion of these openings 132, a second set of alignment pegs 135 is inserted, as illustrated in FIG. 39. Then, as illustrated in FIG. 40, a third layer 141 of photoresist sheet can then be aligned, mounted and machined down in the same manner as the second layer 131 to provide a three layer laminate. This results in the structural void regions 143 in the third layer 141 being in a proper alignment with the structural void regions 133 in the second layer 131, and the structural void regions 123 in the first layer 121. A third set of pegs 145 may then be inserted in the alignment opening holes formed in the third layer 141 in the same manner as described above and further layers added in a similar manner.

Figure 41:
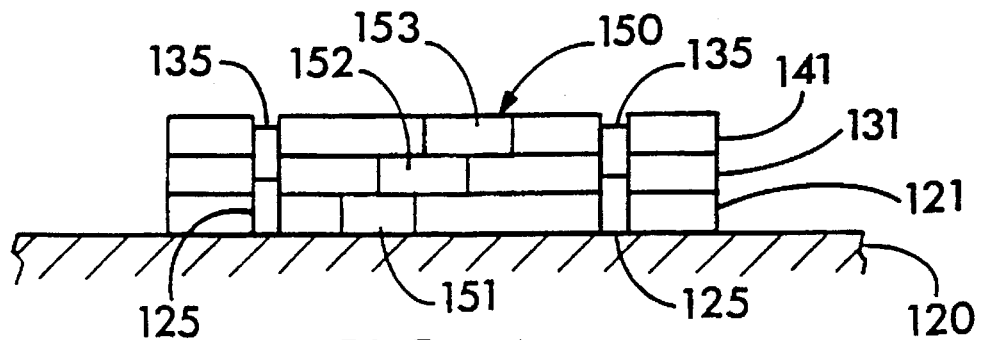
FIG. 41 is an illustrative view of the structure of FIG. 40 with metal electroplated into the open regions left in the multiple layers of photoresist of the structure of FIG. 40.

After the desired number of layers have been built up in the laminate, metal can be electroplated into the structural void regions, if desired. This is illustrated in FIG. 41, in which an electroplated metal piece 150 is formed which has three sections, 151, 152 and 153, which correspond to the structural void regions in the layers 121, 131 and 141, respectively. If the alignment pegs 125 and 135 left in the laminate are formed of photoresist, they too can be removed in the same manner as the photoresist material 121, 131, and 141. If the pegs are formed of metal, they generally will be released from the substrate when the surrounding photoresist layers are removed.

Alternatively, the alignment pegs 125 at the first stage can be fabricated of metal and attached permanently to the substrate. This substrate can then be used multiple times if a completely free metal or photoresist (e.g., PMMA) structures are desired. If such metal pegs are utilized, the first PMMA layer may be exposed and developed separately and then adhered to the substrate surface in proper alignment by insertion of the pegs 125 into the alignment holes formed in the layer.

It is also possible to utilize variations of the foregoing processes which provide development of the exposed regions in the photoresist layers after formation of the laminate. This can be done by partial development so that only the PMMA exposed the positions of the alignment holes are removed, for example, by careful masking of the PMMA layers. Alternatively, the photoresist sheets may have alignment holes machined therein and then be exposed to X-rays under the X-ray mask which is aligned to the holes which had been machined into the photoresist sheet.

By utilizing the foregoing procedures, alignment tolerances of plus or minus 1 micron or less can be obtained while reducing the amount of time required to align the various layers.

It is understood that the invention is not confined to the particular embodiments set forth herein as illustrative, but embraces all such modified forms thereof as come within the scope of the following claims.

What is claimed is:

1. A method of forming microstructures comprising the steps of:
   (a) providing a first preformed sheet of photoresist material which can be exposed to radiation to affect its susceptibility to a developer;
   (b) exposing the first photoresist sheet to radiation in a pattern which will result in susceptibility of the photoresist to a developer partially but not entirely through the thickness of the photoresist sheet;
   (c) applying a developer to the exposed photoresist sheet to remove photoresist which is susceptible to the developer to leave a pattern of voids in the exposed side of the photoresist sheet which voids extend partially but not entirely through the photoresist sheet; and.
   (d) adhering the first photoresist sheet on the side which has the voids formed therein to a layer of material to form a laminate having a pattern of voids between the first photoresist sheet and the layer of material.

2. The method of claim 1 wherein the first photoresist sheet is formed of PMMA.

3. The method of claim 1 wherein the layer of material is a photoresist and including, before the step of adhering the first preformed sheet to the layer of material, the additional steps of exposing the photoresist layer to radiation in a pattern which will affect its susceptibility to a developer, applying a developer to the exposed layer of photoresist to remove photoresist which is susceptible to the developer, and then carrying out the step of adhering the first preformed sheet of photoresist to the layer.

4. The method of claim 3 wherein the first preformed sheet of photoresist and the layer of photoresist are formed of PMMA.

5. The method of claim 1 including the additional step, after the step of adhering the first preformed sheet of photoresist to a layer of material, the additional step of mechanically removing the material of the first preformed photoresist sheet to reduce the thickness of the sheet to fully expose the voids which have been formed in the first preformed sheet.

6. The method of claim 5 wherein the first photoresist sheet is formed of PMMA.

7. The method of claim 5 including, after the step of mechanically removing the material of the first preformed sheet, the additional steps of providing a second preformed sheet of photoresist material which can be exposed to radiation to affect its susceptibility to a developer, exposing the second photoresist sheet to radiation in a pattern which will change the susceptibility of the photoresist to a developer partially but not entirely through the thickness of the second photoresist sheets, applying a developer to the exposed second photoresist sheet to remove the photoresist which is susceptible to the developer to leave voids in one side of the second photoresist sheet which extend partially but not entirely through the thickness of the sheet, and then adhering the second photoresist sheet by the side having voids therein to the surface of the first photoresist sheet.

8. The method of claim 7 including the additional step, after the second photoresist sheet has been adhered to the first photoresist sheet, of mechanically removing the material of the second photoresist sheet to reduce the thickness of the sheet to fully expose the voids formed in the second photoresist sheet.

9. The method of claim 8 wherein the first and second photoresist sheets are both formed of PMMA.

10. The method of claim 9 wherein the steps of exposing the photoresist sheets in a pattern to radiation is carried out by exposing each photoresist sheet to X-rays from a synchrotron.

11. The method of claim 1 wherein the layer of material is a preformed photoresist sheet, and including, before the step of adhering the first preformed photoresist sheet to the layer, the steps of exposing the preformed photoresist sheet layer to radiation in a pattern which will change the susceptibility of the photoresist to a developer partially but not entirely through the thickness of the photoresist sheet layer, and then applying a developer to the exposed photoresist sheet layer to remove photoresist which is susceptible to the developer to leave voids in one side of the layer of photoresist which extend partially but not entirely through the layer of photoresist, and wherein the step of adhering the layer to the first preformed photoresist sheet is carried out by adhering the side of the layer having voids formed therein to the side of the first preformed photoresist sheet which has voids formed therein.

12. The method of claim 11 wherein the first preformed photoresist sheet and the layer are formed of PMMA.

13. The method of claim 11 wherein after the step of adhering the photoresist layer to the first photoresist sheet, the additional step of mechanically removing the material of the first photoresist sheet to reduce the thickness of the sheet to fully expose the voids in the first photoresist sheet.

14. The method of claim 13 including the additional step of adhering the side of the first preformed photoresist sheet which has had material mechanically removed therefrom to an additional layer of material.

15. The method of claim 14 wherein the additional layer of material is a substrate having a flat surface to which the first layer is adhered.

16. The method of claim 14 wherein the additional layer is a preformed photoresist sheet, and including, before the step of adhering the additional layer to the first preformed photoresist sheet, the steps of exposing the additional photoresist sheet in a pattern to radiation which will change its susceptibility to a developer partially but not entirely through the thickness of the additional photoresist sheet, applying a developer to the exposed photoresist of the additional photoresist sheet to remove photoresist which is susceptible to the developer to leave voids in one side of the additional photoresist sheet which extend partially but not entirely through the additional photoresist sheet, and then carrying out the step of adhering the side of the additional photoresist sheet having the voids therein to the first photoresist sheet.

* * * * *